(12) United States Patent
Siegel

(10) Patent No.: US 7,465,909 B2
(45) Date of Patent: Dec. 16, 2008

(54) UV LED CONTROL LOOP AND CONTROLLER FOR CAUSING EMITTING UV LIGHT AT A MUCH GREATER INTENSITY FOR UV CURING

(75) Inventor: Stephen B. Siegel, Chicago, IL (US)

(73) Assignee: Con-Trol-Cure, Inc., Chicago, IL (US)

( * ) Notice: Subject to any disclaimer, the term of this patent is extended or adjusted under 35 U.S.C. 154(b) by 1034 days.

(21) Appl. No.: 10/886,332

(22) Filed: Jul. 7, 2004

(65) Prior Publication Data

US 2004/0238111 A1 Dec. 2, 2004

Related U.S. Application Data

(63) Continuation-in-part of application No. 10/753,947, filed on Jan. 7, 2004, now Pat. No. 7,211,299, and a continuation-in-part of application No. 10/386,980, filed on Mar. 12, 2003, now abandoned, and a continuation-in-part of application No. 10/339,264, filed on Jan. 9, 2003, now Pat. No. 7,175,712.

(51) Int. Cl.
*G01J 1/32* (2006.01)

(52) U.S. Cl. .................... 250/205; 250/214 R
(58) Field of Classification Search ............... 250/205, 250/214 R, 214 A, 214 LA; 315/111.21, 315/111.31; 362/227–247; 156/379.6, 272.2; 347/52, 101, 102, 100, 213, 224; 101/424.1, 101/488, 491, 484
See application file for complete search history.

(56) References Cited

U.S. PATENT DOCUMENTS 3,737,051 A 6/1973 Horino (Continued)

FOREIGN PATENT DOCUMENTS

GB 2350321 A 11/2000

(Continued)

OTHER PUBLICATIONS

Webster's Ninth New Collegiate Dictionary, Merriam-Webster INC., Springfiled, Mass., USA, 1990 (no month), excerpt p. 199 & 394.

(Continued)

*Primary Examiner*—Que T Le
(74) *Attorney, Agent, or Firm*—Neal Gerber & Eisenberg LLP

(57) ABSTRACT

A UV curing apparatus and method is provided for efficiently decreasing the curing time for the curing of a UV curable product, article or other object having a UV curable coating, ink or adhesive by at least one array of UV LED chips on a substrate. Advantageously, the UV LED chips are driven at a current ranging from 2 to 4 times higher than the normal operating current for the UV LED chips to cause the UV LED chips to emit UV light at a much greater intensity than when the UV LED chips are driven at their normal operating current. For enhanced results, the UV LED chips are cooled during operation of the apparatus and system, so that the UV LED chips can be driven at a higher current for a longer period of time.

29 Claims, 3 Drawing Sheets

U.S. PATENT DOCUMENTS

| | | | |
|---|---|---|---|
| 3,800,160 A | 3/1974 | Ishizawa et al. | |
| 3,819,929 A | 6/1974 | Newman | |
| 4,010,374 A | 3/1977 | Ramler | |
| 4,033,263 A * | 7/1977 | Richmond | 101/424.1 |
| 4,145,136 A | 3/1979 | Takahashi | |
| 4,309,452 A | 1/1982 | Sachs | 427/44 |
| 4,490,410 A | 12/1984 | Takiyama et al. | |
| 4,910,107 A | 3/1990 | Kawada et al. | |
| 4,980,701 A | 12/1990 | Contois et al. | 346/107 |
| 4,990,971 A | 2/1991 | Le Creff | |
| 5,062,723 A | 11/1991 | Takeda et al. | |
| 5,278,432 A | 1/1994 | Ignatius et al. | |
| 5,278,482 A | 1/1994 | Bahn | |
| 5,420,768 A | 5/1995 | Kennedy | |
| 5,535,673 A | 7/1996 | Bocko et al. | 101/211 |
| 5,634,711 A | 6/1997 | Kennedy et al. | 362/32 |
| 5,660,461 A | 8/1997 | Ignatius et al. | 362/241 |
| 5,731,112 A | 3/1998 | Lewis et al. | |
| 5,762,867 A | 6/1998 | D'Silva | |
| 5,764,263 A | 6/1998 | Lin | |
| 5,840,451 A | 11/1998 | Moore et al. | |
| D404,045 S | 1/1999 | Mandellos | |
| D404,046 S | 1/1999 | Mandellos | |
| D404,409 S | 1/1999 | Mandellos | |
| 5,857,767 A | 1/1999 | Hochstein | 362/294 |
| 5,963,240 A | 10/1999 | Shinohara et al. | |
| 5,973,331 A | 10/1999 | Stevens et al. | |
| 5,986,682 A | 11/1999 | Itou | |
| 5,990,498 A | 11/1999 | Chapnik et al. | |
| 6,013,330 A | 1/2000 | Lutz | |
| 6,075,595 A | 6/2000 | Malinen | |
| 6,092,890 A | 7/2000 | Wen et al. | 347/101 |
| 6,112,037 A | 8/2000 | Nagata et al. | |
| 6,145,979 A | 11/2000 | Caiger et al. | |
| 6,163,036 A | 12/2000 | Taninaka et al. | 257/88 |
| 6,185,394 B1 | 2/2001 | Lee | |
| 6,188,086 B1 | 2/2001 | Masuda et al. | |
| 6,200,134 B1 | 3/2001 | Kovac et al. | |
| 6,354,700 B1 | 3/2002 | Roth | |
| 6,425,663 B1 | 7/2002 | Eastlund et al. | |
| 6,447,112 B1 | 9/2002 | Hu et al. | |
| 6,457,823 B1 | 10/2002 | Cleary et al. | |
| 6,498,355 B1 | 12/2002 | Harrah et al. | 257/99 |
| 6,501,084 B1 | 12/2002 | Sakai et al. | |
| 6,517,218 B2 | 2/2003 | Hochstein | |
| 6,523,948 B2 | 2/2003 | Matsumoto et al. | |
| 6,525,752 B2 | 2/2003 | Vackier et al. | |
| 6,528,955 B1 | 3/2003 | Powers et al. | |
| 6,536,889 B1 | 3/2003 | Biegelsen et al. | 347/95 |
| 6,561,640 B1 | 5/2003 | Young | 347/102 |
| 6,589,716 B2 | 7/2003 | Sweatt et al. | |
| 6,613,170 B1 | 9/2003 | Ohno | |
| 6,630,286 B2 | 10/2003 | Kramer | |
| 6,671,421 B1 | 12/2003 | Ogata et al. | |
| 6,683,421 B1 | 1/2004 | Kennedy et al. | 315/291 |
| 6,726,317 B2 | 4/2004 | Codos | |
| 6,755,647 B2 | 6/2004 | Melikechi et al. | |
| 6,783,810 B2 | 8/2004 | Jin et al. | |
| 6,807,906 B1 | 10/2004 | DeMoore et al. | |
| 6,880,954 B2 | 4/2005 | Ollett et al. | |
| 6,885,035 B2 | 4/2005 | Bhat et al. | |
| 6,949,591 B1 | 9/2005 | Allard et al. | |
| 7,080,900 B2 | 7/2006 | Takabayashi et al. | |
| 7,137,696 B2 | 11/2006 | Siegel | |
| 7,153,015 B2 | 12/2006 | Brukilacchio | |
| 7,175,712 B2 | 2/2007 | Siegel | |
| 2001/0030866 A1 | 10/2001 | Hochestein | |
| 2001/0032985 A1 | 10/2001 | Bhat et al. | 257/88 |
| 2001/0046652 A1 | 11/2001 | Ostler et al. | 433/29 |
| 2001/0048814 A1 | 12/2001 | Lenmann et al. | 396/154 |
| 2001/0052920 A1 | 12/2001 | Matsumoto et al. | |
| 2002/0015234 A1 | 2/2002 | Suzuki et al. | |
| 2002/0016378 A1 | 2/2002 | Jin et al. | 522/1 |
| 2002/0044188 A1 | 4/2002 | Codos | 347/106 |
| 2002/0074554 A1 | 6/2002 | Sweatt et al. | |
| 2002/0074559 A1 | 6/2002 | Dowling et al. | 247/99 |
| 2002/0149660 A1 | 10/2002 | Cleary et al. | |
| 2002/0172913 A1 | 11/2002 | Cao | |
| 2002/0175299 A1 | 11/2002 | Kanie et al. | |
| 2003/0035037 A1 | 2/2003 | Mills et al. | |
| 2003/0109599 A1 | 6/2003 | Kamen | |
| 2003/0218880 A1 | 11/2003 | Bruckilacchio | |
| 2003/0222961 A1 | 12/2003 | Atsushi | |
| 2004/0011457 A1 | 1/2004 | Kobayashi et al. | 156/272.2 |
| 2004/0090794 A1 | 5/2004 | Ollett et al. | 362/555 |
| 2004/0114016 A1 | 6/2004 | Yokoyama | |
| 2004/0134603 A1 | 7/2004 | Kobayashi et al. | 156/272.8 |
| 2004/0135159 A1 | 7/2004 | Siegel | |
| 2004/0152038 A1 | 8/2004 | Kumagai | |
| 2004/0156130 A1 | 8/2004 | Powell et al. | |
| 2004/0164325 A1 | 8/2004 | Siegel | |
| 2004/0166249 A1 | 8/2004 | Siegel | |
| 2004/0189773 A1 | 9/2004 | Masumi | |
| 2004/0238111 A1 | 12/2004 | Siegel | |
| 2005/0099478 A1 | 5/2005 | Iwase | |
| 2005/0104946 A1 | 5/2005 | Siegel | |
| 2005/0152146 A1 | 7/2005 | Owen et al. | |
| 2005/0222295 A1 | 10/2005 | Siegel | |
| 2006/0007290 A1 | 1/2006 | Oshima et al. | |
| 2006/0127594 A1 | 6/2006 | Siegel | |
| 2006/0192829 A1 | 8/2006 | Mills et al. | |
| 2006/0204670 A1 | 9/2006 | Siegel | |
| 2006/0230969 A1 | 10/2006 | Vosahlo | |
| 2006/0233501 A1 | 10/2006 | Sampson | |
| 2006/0237658 A1 | 10/2006 | Waluszko | |
| 2006/0245187 A1 | 11/2006 | Scott et al. | |

FOREIGN PATENT DOCUMENTS

| | | |
|---|---|---|
| GB | 2390332 A | 1/2004 |
| GB | 2396331 A | 6/2004 |
| JP | 60-126830 | 7/1985 |
| JP | 62-026876 | 2/1987 |
| JP | 1-124324 | 5/1989 |
| JP | 5-323462 | 12/1993 |
| JP | 11-277795 | 10/1999 |
| JP | 2000-268416 B | 9/2000 |
| JP | 2001-209980 B | 8/2001 |
| JP | 2002-248803 | 9/2002 |
| JP | 2005-129662 B | 5/2005 |
| WO | WO 01/11426 A | 2/2001 |
| WO | WO 02/093265 A | 11/2002 |
| WO | WO 03/096387 A | 11/2003 |
| WO | WO 2004/002746 A1 | 1/2004 |
| WO | WO 2004/011848 A2 | 2/2004 |
| WO | WO 2004/081475 A | 9/2004 |

OTHER PUBLICATIONS

PCT International Search Report and Written Opinion of International Searching Authority, mailed on Oct. 13, 2004 for International Application No.PCT/US04/01495, International Filing Date Jan. 21, 2004 for Applicant, Con-Trol-Cure, Inc.

Pappas, Peter, ed., UV Curing: Science And Technology, "Light Sources" (by Vincent McGinniss), technology marketing Corp.,stand forward, Connecticut, USA, 1978 (no month).

PCT International Search Report, mailed on Oct. 14, 2005 for International Application No. PCT/US04/01594, International Filing Date Jan. 23, 2004 for Applicant, Con-Trol-Cure, Inc.

PCT International Search Report, mailed on Apr. 20, 2005 for International Application No. PCT/US04/38069, International Filing Date Nov. 16, 2004 for Applicant, Con-Trol Cure, Inc.

PCT International Search Report, mailed on Feb. 11, 2005 for International Application No. PCT/US04/21655, International Filing Date Jul. 7, 2004 for Applicant, Con-Trol Cure, Inc.

PCT International Search Report and Written Opinion of International Searching Authority, mailed on Feb. 11, 2005 for International Application No. PCT/US04/20935, International Filing Date Jun. 29, 2004 for Applicant, Con-Trol-Cure, Inc.

PCT International Search Report, mailed on Apr. 20, 2005 for International Application No. PCT/US04/38068, International Filing Date Nov. 16, 2004 for Applicant, Con-Trol-Cure, Inc.

PCT International Search Report, mailed on Sep. 14, 2006 for International Application No. PCT/US05/34726, International Filing Date Sep. 27, 2005 for Applicant, Con-Trol-Cure, Inc.

PCT International Search Report, mailed on Apr. 6, 2006 for International Application No. PCT/US05/33619, International Filing Date Sep. 20, 2005 for Applicant, Con-Trol-Cure, Inc.

PCT International Search Report, mailed on Jun. 28, 2007 for International Application No. PCT/US07/061116, International Filing Date Jan. 26, 2007 for Applicant, Con-Trol-Cure, Inc.

Written Option dated Sep. 10, 2007 for corresponding Singapore Patent Application No. 200604514.

Korean Office Action dated Sep. 10, 2007 for corresponding Korean Patent Application No. 10-2006-7015718.

Publication: *"Photoinitiators for UV Curing Key Products Selection Guide, Coating Effects"*, by Ciba Specialty Chemicals, Edition 2001, Switzerland.

Publication: *"Photoinitiators for UV Curing Formulators' Guide for Coatings, Additives"*, by Ciba Speciality Chemicals, Edition 2001, Switzerland.

Publication: *"Optical Properties of Si-Doped $Al_xGa_{1-x}N/Al_yGa_{1-y}N$ ($x=0.24-0.53$. $y=0.11$) Multi-Quantum-Well Structures"* by. H. Hirayama and Y. Aoyagi, The Institute of Physical and Chemical Research, Saitama, Japan, MRS Internet J. Nitride Semicond. Res. 4S1,G3.74 (1999).

Office Action dated Feb. 1, 2008 for Chinese Patent Application 200480040014.3.

Korean Office Action dated Mar. 17, 2008 for corresponding Korean Patent Application No. 10-2006-7015718.

Australian Office Written Opinion dated Jun. 20, 2008 for Application No. SG 200604512-4.

Supplementary European Search Report dated Jul. 11, 2008 for Application No. EP 04 80 1055.

Supplementary European Search Report dated Jul. 8, 2008 for Application No. EP 04 80 1056.

Supplementary European Search Report dated Jul. 14, 2008 for Application No. EP 04 82 1128.

Supplementary European Search Report dated Jul. 15, 2008 for Application No. EP 04 77 7269.

International Preliminary Report on Patentability for Application No. PCT/US2007/061116.

Office Action dated Jun. 20, 2008 for U.S. Appl. No. 10/907,180.

Office Action dated Aug. 19, 2008 for U.S. Appl. No. 11/561,843.

European Search Report dated Aug. 1, 2008 for Application No. EP 04 70 4792.

Notice of Allowance dated Aug. 2, 2008 for U.S. Appl. No. 10/907,180.

* cited by examiner

UV LED CONTROL LOOP AND CONTROLLER FOR CAUSING EMITTING UV LIGHT AT A MUCH GREATER INTENSITY FOR UV CURING

CROSS-REFERENCE TO RELATED APPLICATIONS

This application is a continuation-in-part of U.S. application Ser. No. 10/753,947, filed Jan. 7, 2004, for a "UV Curing Method and Apparatus" which is a continuation-in-part of U.S. application Ser. No 10/386,980 filed Mar. 12, 2003, for "Multiple Wavelength UV Curing" which is a continuation-in-part of U.S. application Ser. No. 10/339,264 filed Jan. 9, 2003, for "A Light Emitting Apparatus and Method for Curing Inks, Coatings and Adhesives".

BACKGROUND OF THE INVENTION

1. Field of the Invention

The present invention relates to a method and apparatus for more rapid UV curing of inks, coatings and adhesives having ultraviolet (UV) photo initiators therein which, when exposed to UV light, convert monomers in the inks, coatings and adhesives to linking polymers to solidify the monomer material. More specifically, the present invention relates to a method and apparatus for driving UV light emitting diodes (LED) chips at 2-4 times their normal current rating to obtain an increase in light intensity up to 8 times greater than when they are operated at their normal current rating and with the greater light intensity, curing the inks, coatings or adhesives more quickly.

2. Description of the Related Art

Heretofore, UV-LEDs have been proposed for supplying UV light for curing inks, coatings and adhesives. However, the speed of curing is usually limited by the light intensity of the UV light. Furthermore, light intensity decreases as the UV LED chips are heated during operation of same.

BRIEF SUMMARY OF THE INVENTION

As will be described in greater detail hereinafter, the method and apparatus of the present invention provide techniques and structures for applying high intensity UV light from UV-LED chips in an array or arrays to a UV curable product, article, ink, coating, adhesive, or other object to be cured thereby reducing the curing time. This is achieved by driving the UV LED chips with a current that is 2-4 times greater than their normal operating current while at the same time cooling the UV LED chips with a heat pump so they can be driven at a high operating current for a sufficient time to achieve rapid curing before the UV LED chips are overheated and the light intensity of the emitted light decreases. A control loop including a light intensity sensor and a heat sensor and a controller are used to control the UV light output.

According to one teaching of the present invention, there is provided a method for decreasing the curing time for the curing of a UV curable product, article, or other object having a UV curable coating, ink or adhesive thereon comprising the steps of: positioning a UV curable product, article or other object having a UV curable coating, ink or adhesive thereon beneath, near or in proximity to and in the UV light path of an array or arrays of UV LED chips; electrically driving the UV LED chips at a current 2 to 4 times higher than the normal operating current for those UV LED chips thereby to cause the UV LED chips to emit UV light at a much greater intensity than when the UV LED chips are driven at the normal operating current; and, cooling a substrate mounting, securing, and supporting the UV LED chips so that the UV LED chips can be driven at the higher current for a longer period of time than if they were not cooled.

Further according to one of the teachings of the present invention, there is provided: a UV curing system for decreasing the curing time for the curing of a UV curable product, article or other object having a UV curable coating, ink or adhesive thereon comprising a UV curing station; at least one array of UV LED chips at, adjacent or in proximity to the UV curing station; a positioning mechanism for placing a UV curable product, article or other object having a UV curable coating, ink or adhesive thereon or therein beneath, near or in proximity to the normal area of the UV light path of at least one array of UV LED chips; UV control circuitry for electrically driving the UV LED chips at a current ranging from about 2 to about 4 times higher than the normal operating current for the UV LED chips thereby to cause the UV LED chips to emit UV light at a much greater intensity than when the UV LED chips are driven at their normal operating current; and, a cooling device or mechanism for effectively cooling a substrate mounting, securing and supporting the UV LED chips so that they can be driven at the higher current for a longer period of time than if they were not cooled.

DETAILED DESCRIPTION OF THE INVENTION

A detailed description of the preferred embodiments and best modes for practicing the invention are described herein.

Figure 1:
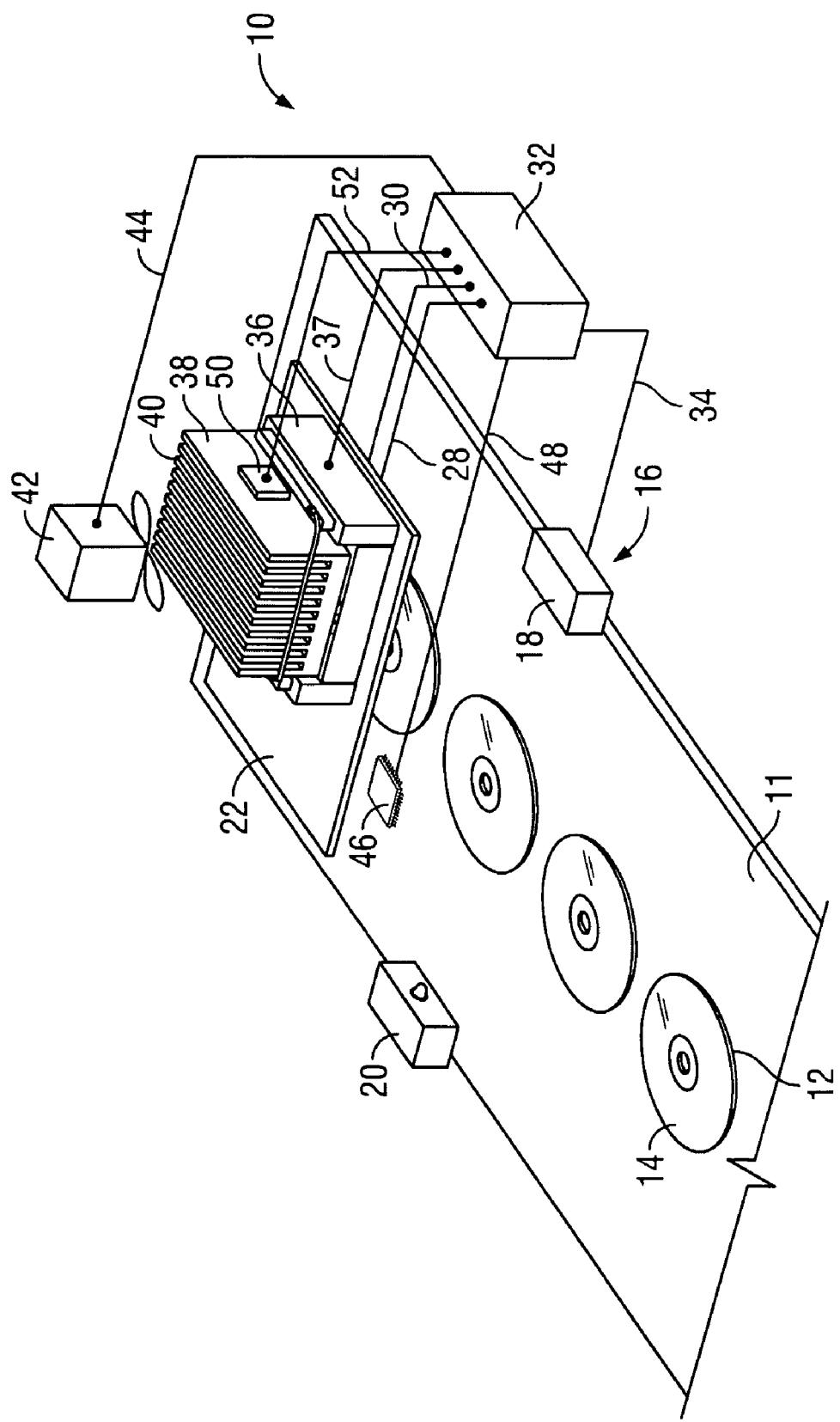
FIG. 1 is a perspective view of an apparatus which is constructed according to the teachings of the present invention and which employs a heat pump for cooling one or more arrays of UV LED's which are electrically driven beyond their normal rating and a feedback loop including a controller for shutting off the UV LEDs when their temperature reaches a predetermined or certain level and/or the intensity of the UV light emitted from the UV LED's diminishes below a predetermined or certain level.

Referring now to the drawings in greater detail, there is illustrated in FIG. 1 a UV LED curing station 10 which is positioned adjacent and above a conveyor 11.

On the conveyor 11 are shown a plurality of UV curable products, articles or other object, in this instance, compact disks (CDs) 12, each of which has a top side 14 which has been coated and/or printed with a UV curable coating and/or UV curable ink.

At or in proximity to the UV curing station 10 is positioned a product sensing system 16. The sensing system can include an optical sensing system with an electric eye sensor 18 which detects and senses a light beam from a light emitter 20 for sensing when a compact disk 12 or other UV curable product, article, or object is present at the UV curing station 10 and in the normal area of a UV light path.

The sensing system 16 can take other forms, such as, for example a motion detector system. Furthermore, when the UV curable coated or printed product includes a magnetizable metal, a magnetic detector system can be used. The sensing system can also include a pressure sensor or weight detector.

The UV curing station includes a heat conducting substrate 22 (FIG. 1) having mounted on the underside thereof, several arrays 24 (FIG. 3) of UV LED chips 26 that are electronically coupled via wire conductors 28 and 30 (FIG. 1) to a controller 32. The sensing system 16 is also coupled to the controller 32 by wire conductor(s) 34. When the sensing system 16 signals the controller 32 that a printed or coated compact disk 12 or other UV curable product, article, or object is present beneath the substrate 22 having the plurality of arrays 24 (FIG. 3) of UV LED chips 26 on the underside thereof, the controller 32, according to the teachings of the present invention, causes the UV LED chips 26 (FIG. 1) to be electrically energized and driven electrically in excess of their normal rating, preferably in an amount ranging from 2 to 4 times above the rated current for the UV LED chips 26 via the electric wire conductors 28 and 30. UV light at high intensity is then emitted and directed toward the compact disk 12, or other UV curable product, article or object, at the curing station 10.

It is preferred that the substrate 22 (FIG. 1) having the arrays 24 (FIG. 3) of UV LED chips 26 on the underside thereof is positioned as close as possible to the compact disk 12 (FIG. 1) or other UV curable product, article, or object since light intensity decreases exponentially as the distance that the UV light beam has to travel from the point of emission of the UV LED chips to the object to be cured increases.

When the UV LED chips 26 (FIG. 3) are driven beyond their normal rating range, they will heat up quickly. As a result, the intensity of the UV LED light emitted from the UV LED chip decreases dramatically. To enable the UV LED chips 26 to be driven beyond their normal rating, a cooling device such as a heat pump 36 (FIG. 1) is mounted on the substrate 22 to help dissipate and draw off the heat generated in the UV led chips 26 by driving them beyond their normal operating range. The heat pump 36 is coupled to the controller 32 by wire conductor(s) 37 but is typically maintained ON all the time during UV curing at the UV curing station 10. In one embodiment, the arrays 24 (FIG. 3) of UV LED chips 26 are fixed to the thermally conductive substrate 22 (FIG. 1) by a conductive adhesive to better conduct the heat from the UV LED chips 26 (FIG. 3) to the thermally conductive substrate 22 and from there by the colder side of the heat pump 36 (FIG. 1).

The heat pump 36 can be a Melcor Thermoelectric heat pump sold by MELCOR CORPORATION of Trenton, N.J.

Initially the colder side of the heat pump 36 (FIG. 1) will cool the thermally conductive substrate 22 mounting the UV LED chips. However, in view of the large amount of heat generated by the UV LED chips being driven beyond their normal operating range, the normal capacity of the heat pump can be exceeded. Accordingly, to further dissipate heat, the hotter side of the heat pump 36 has a heat sink 38 mounted thereon. The heat sink 38 typically has a plurality, set or array of heat radiating fins 40 extending outwardly from the heat pump 36 for radiating heat into the ambient air to dissipate the heat by convection. Still further, to assist in the dissipation of heat from the fins 40, a motor operable fan 42 is coupled by wire conductor(s) 44 to the controller 32. The operation of the fan 42 can be controlled by the controller 32 coupled by wire conductor(s) 44 to the fan 42. Typically the fan 42 is maintained ON all the time UV curing occurs at the UV curing station 10.

To control operation of the UV LED chips, a light intensity sensor 46 (FIG. 1) can be positioned beneath the arrays 24 of UV LED chips 26 and is coupled by wire conductor(s) 48 to the controller 32. Further sensing and control can be obtained with a heat sensor 50 on or near the heat sink 38 which is coupled by wire conductor(s) 52 to the controller 32.

Desirably, the UV LED chips 26 (FIG. 3) coupled to the controller 32 (FIG. 1), the light sensor 46 and the heat sensor 50 comprise a control loop.

Figure 3:
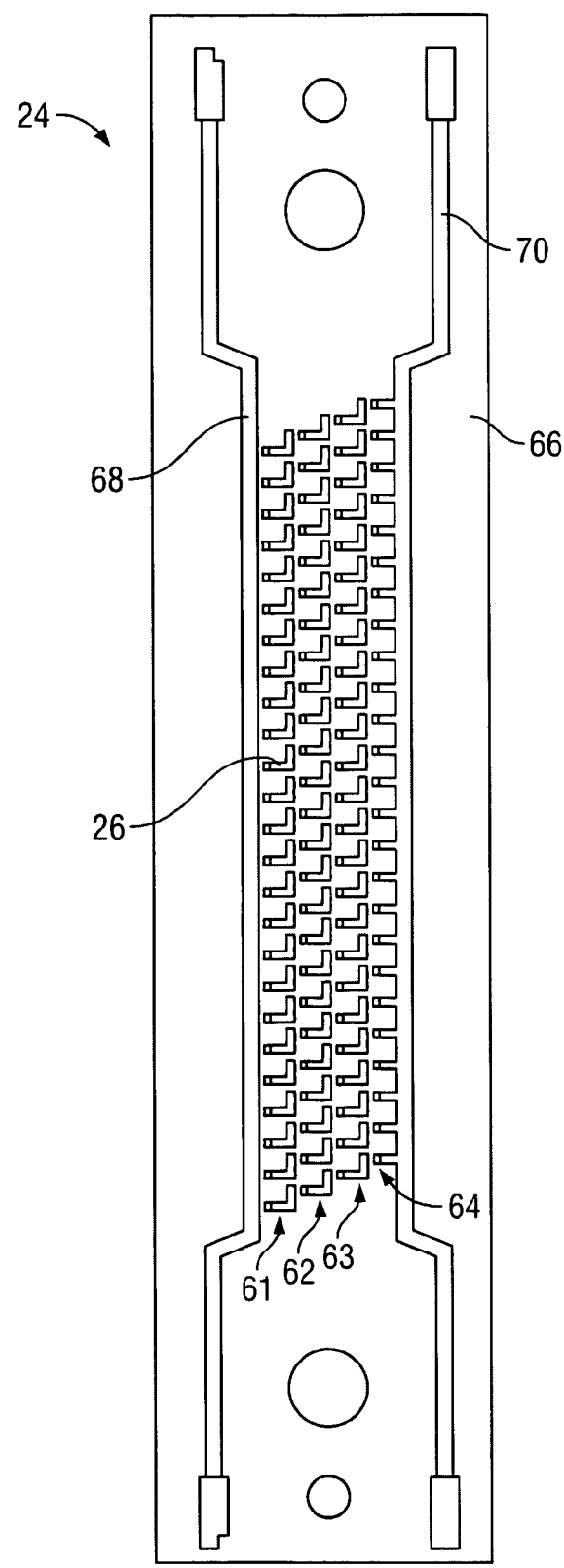
FIG. 3 is a plan view of one die array of four rows of UV LED chips.

As shown in FIG. 3, one panel array 24 of four rows 61, 62, 63 and 64 of UV LED chips 26 are arranged on a die panel 66. The die panel 66 can be about four inches long and can have two bus strips 68 and 70 thereon connected to the UV LED chips 26.

The UV LED chips 26 (FIG. 3) in one row 61 can be staggered from the UV LED chips 26 in the other rows 62, 63 and 64 so that overlapping light beams are emitted from each UV LED chip 26 in the staggered array of rows 61-64 of UV LED chips 26. In this way, a more complete and uniform illumination and emission of UV light on the printing and/or coating on the compact disk 14 (FIG. 1) or other UV curable product, article or object is assured.

In the operation of the control loop, once the product sensing system 16 (FIG. 1) senses a UV curable product, article, or other object, such as a compact disk 12, underneath the array 24 (FIG. 3) of the UV LED chips 26 on the underside of the substrate 22 (FIG. 1), the controller 32 activates, energizes and turns on the UV LED chips 26 (FIG. 3) and drives them in an amount ranging from 2 to 4 times their normal operating range, typically 3 times their normal operating range.

Figure 2:
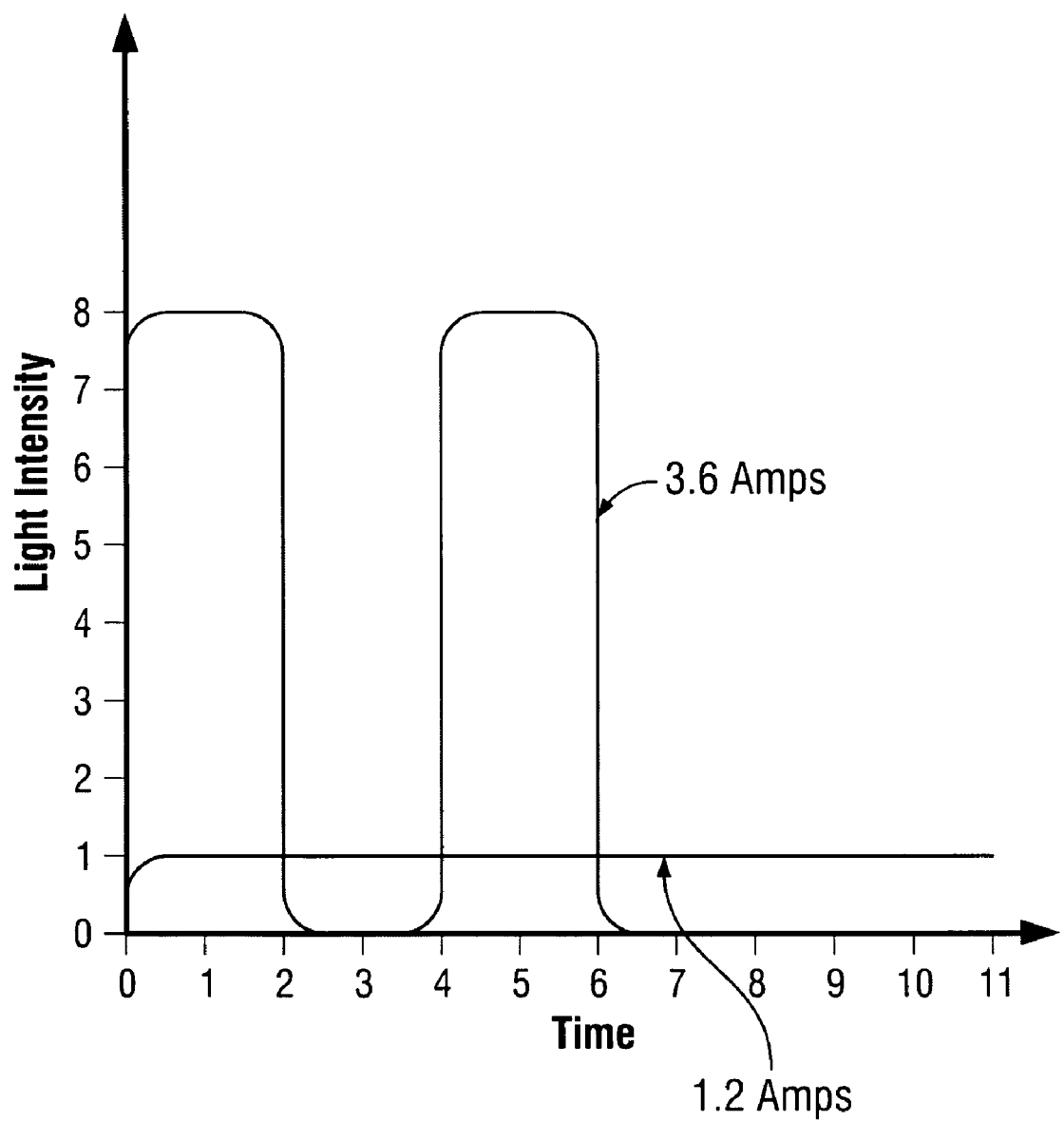
FIG. 2 is a graph illustrating the current applied to one type of UV LED array as a function of UV light intensity and time.

For example, as shown in the graph of FIG. 2, once a set of UV LED chips is normally driven at 1.2 amps, the controller drives them at 3.6 amps until the light intensity starts to diminish in a time period of approximately 2 seconds.

Empirically, it was found that when the UV LED chips are driven beyond their normal range, such as 3 times their normal operation range, they emit light at an intensity up to 8 times greater than the light intensity emitted by the UV LED chips when they are driven at their normal current rating of approximately 1.2 amps. This difference in light intensity is illustrated in the graph of FIG. 2.

The decrease in light intensity can be sensed by the light sensor 46 (FIG. 1). The increase in temperature of the heat sink 38 can be sensed by the heat sensor (temperature sensor) 50. When a decrease in light intensity is sensed by the light sensor below a certain value and/or an increase in temperature above another value is sensed by the temperature sensor, the controller 32 reduces, decreases or shuts off the supply of electric current via the conductors 28, 30 to the UV LED chips 26 (FIG. 3) on the underside of the substrate 22 (FIG. 1).

Concurrently, the heat pump 36 (FIG. 1) is working to dissipate and draw away heat from the substrate 22 and thereby cool down the UV LED chips 26 (FIG. 3). Typically, the substrate 22 (FIG. 1) is cooled down sufficiently in about two seconds by the combined operation of the heat pump 36, the radiation and dissipation of heat from the heat fins 40 of the heat sink 38, and by the cooling air propelled by the fan 42 across the heat fins.

The decreased energization time (de-energizing time) or off time can be synchronized with the movement of the conveyor 11 (FIG. 1) which takes about 2 seconds to move a subsequent compact disk or other UV curable product, article or object, to a position in front of the electric eye sensor 18 and beneath the substrate 22 at the curing station 10.

The above cycle and procedure is repeated for the subsequent compact disk 12 (FIG. 1).

Empirical tests have shown that operating the UV LED chips 26 (FIG. 3) three (3) times above their normal operating range does not appear to adversely affect their operating life while a much shorter curing time is achieved with the control loop and controller of the present invention.

If desired, an oscillating mechanism for oscillating the substrate, as illustrated and described in applicant's earlier applications referred to in the Cross Reference to Related Applications which are hereby incorporated by reference, can be provided for oscillating the substrate 22 (FIG. 1) further to ensure an even and more uniform application of UV curing light to the UV curable product, article or other object, e.g., the compact disks 12.

Among the many advantages of the UV curing system and method of the invention are:
1. Superior performance;
2. Better quality products;
3. Excellent curing;
4. Faster curing;
5. More uniform curing;
6. Improved quality control;
7. Easy to operate;
8. Simple to use and install;
9. Economical;
10. Efficient; and
11. Effective.

The UV LED control loop and controller for UV curing and their method of operation provide numerous advantages some of which have been described above and others of which are inherent in the invention. Advantageously, the UV curing system and method of the invention achieves surprisingly good and unexpected results.

Although embodiments of the invention have been shown and described, it will be understood that various modifications and substitutions, as well as rearrangements of components, parts, equipment, apparatus, process (method) steps, and uses thereof, can be made by those skilled in the art without departing from the teachings of the invention. Accordingly, the scope of the invention is only to be limited as necessitated by the accompanying claims.

What is claimed is:

1. A method for decreasing the curing time for the curing of a UV curable product, article or other objects having a UV curable coating, ink or adhesive thereon, comprising the steps of:
   positioning a UV curable product, article or other object having a UV curable coating, ink or adhesive thereon in proximity to and in the UV light path of at least one array of UV LED chips;
   electrically driving the UV LED chips at a current between about 2 to about 4 times higher than the normal operating current for the UV LED chips thereby to cause the UV LED chips to emit UV light at a much greater intensity than when the UV LED chips are driven at their normal operating current; and,
   cooling a substrate of the UV LED chips so that the UV LED chips can be driven at the higher current for a longer period of time than if they were not cooled.

2. The method of claim 1 wherein the step of cooling is achieved by using a heat pump having its colder side positioned in proximity to the substrate.

3. The method of claim 2 wherein said cooling is further enhanced by positioning a heat sink on the hotter side of the heat pump.

4. The method of claim 3 wherein said cooling is further enhanced by:
   positioning on the hotter side of the heat pump, a heat sink having heat radiating fins; and by blowing cooling air over the heat radiating fins with a fan.

5. The method of claim 1 including the step of sensing the light intensity of the UV light emitted from the UV LED chips and reducing the level of current to the UV LED chips when the UV light intensity diminishes below a predetermined level.

6. The method of claim 4 including the step of sensing the temperature of the heat sink and reducing the level of current to the UV LED chips when the temperature of the heat sink exceeds a certain level.

7. The method of claim 1 including the steps of:
   sensing when a UV curable product, article, or other object having a UV coating, ink, or adhesive thereon is positioned in the normal area of the UV light path from the array of UV LED chips; and
   energizing the UV LED chips subsequent to such optical sensing.

8. The method of claim 1 wherein the UV LED chips are energized over a portion of a duty cycle while the cooling is performed substantially continuously so that the substrate of the UV LED chips is substantially continuously cooled.

9. The method of claim 8 wherein the duty cycle is dependent upon the speed of a conveyor in moving a UV curable product, article or other object into the UV light path of the array of UV LED chips.

10. The method of claim 8 wherein the UV LED chips are intermittingly energized and de-energized and the portion of the duty cycle where the UV LED chips are de-energized is greater than the portion of the duty cycle wherein the UV LED chips are energized.

11. The method of claim 8 wherein the period of the duty cycle of UV LED chips are ON versus the period of the duty cycle of UV LED chips are OFF are approximately equal.

12. The method of claim 1 wherein the UV LED chips are driven at a current approximately 3 times the normal operating current for the UV LED chips.

13. The method of claim 1 wherein the light intensity of the UV light emitted from the UV LED chips when driven at about 2 to about 4 times the current rating for the UV LED chips is up to 8 times greater than for UV LED chips electrically driven at the normal current rating for the UV LED chips.

14. The method of claim 1 including the step of oscillating the substrate to ensure substantially uniform application of UV light to the product.

15. A UV curing system for decreasing the curing time of a UV curable product, article or other object having a UV curable coating, ink or adhesive thereon, comprising:
   a UV curing station;
   at least one array of UV LED chips on a substrate in proximity to said UV curing station;
   a positioning mechanism for positioning a UV curable product, article or other object having a UV curable coating, ink or adhesive thereon in the UV light path of at least one array of UV LED chips;
   control circuitry for electrically driving said UV LED chips at a current ranging from about 2 to about 4 times higher than the normal operating current for said UV LED chips thereby to cause said UV LED chips to emit UV light at a much greater intensity than when said UV LED chips are driven at their normal operating current; and
   a cooling device for cooling said UV LED chips so that they can be driven at the higher current for a longer period of time than if they were not cooled.

16. The system of claim 15 wherein said cooling device is a heat pump having its colder side mounted in proximity to said substrate.

17. The system of claim 16 wherein a heat sink is mounted on a hotter side of said heat pump.

18. The system of claim 17 wherein said heat sink has an array of heat radiating fins.

19. The system of claim 18 including a fan positioned to blow cooling air over said heat radiating fins.

20. The system of claim 15 including a light sensor coupled to said controller in said control circuitry and positioned in proximity to the UV light path of UV light emitted from said UV LED chips for sensing the intensity of UV light emitted from said UV LED chips; and
   said controller being operable to reduce the level of current to said UV LED chips when the UV light intensity diminishes below a certain level.

21. The system of claim 17 including:
   a heat sensor coupled to said controller and positioned adjacent said heat sink for sensing the temperature of said heat sink; and
   said controller being operable to reduce the level of current to the UV LED chips when the temperature of said heat sink exceeds a predetermined level.

22. The system of claim 15 including:
   a product sensing system coupled to said controller and being positioned in proximity to said UV curing station for sensing when a UV curable product, article or other object having a UV coating, ink, or adhesive thereon is positioned in the normal area of the UV light path of said array of UV LED chips at said UV curing station; and
   said controller being operable to energize said UV LED chips subsequent to said sensing by said product sensing system.

23. The system of claim 15 wherein said product sensing system comprises at least one device selected from the group consisting of: an optical sensor, a motion detector a pressure sensor, and a weight detector.

24. The system of claim 15 wherein said controller is a programmable controller for electrically energizing said UV LED chips over a portion of a duty cycle while the cooling is performed substantially continuously by said cooling device.

25. The system of claim 24 wherein:
   said positioning mechanism comprises a conveyor; and
   the duty cycle is dependent upon the speed of the conveyor positioning a UV curable product, article or other object in position under said at least one array of UV LED chips.

26. The system of claim 24 wherein the duty cycle includes:
   a reduced current portion where the level of current supplied to said UV LED is reduced; and
   an energizing portion wherein the UV LED chips are electrically energized.

27. The system of claim 24 wherein the period of the duty cycle of UV LED chips are ON versus the period of the duty cycle of UV LED chips are OFF are approximately equal.

28. The system of claim 15 wherein said controller drives said UV LED chips at a current approximately 3 times the normal operating current for said UV LED chips.

29. The system of claim 15 wherein the light intensity of the light emitted from said UV LED chips when driven at a range of about 2 to about 4 times the current rating for said UV LED chips is up to about 8 times greater than for UV LED chips electrically driven at the normal current rating for said UV LED chips.

* * * * *